(12) United States Patent
Hynecek

(10) Patent No.: US 7,002,129 B2
(45) Date of Patent: Feb. 21, 2006

(54) CHARGE DETECTION NODE WITH RESET FEED-THROUGH SHIELDING GATE

(75) Inventor: Jaroslav Hynecek, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 298 days.

(21) Appl. No.: 10/600,562

(22) Filed: Jun. 20, 2003

(65) Prior Publication Data

US 2005/0012527 A1 Jan. 20, 2005

(51) Int. Cl.
*H01L 27/00* (2006.01)
(52) U.S. Cl. ..................... 250/208.1; 327/91
(58) Field of Classification Search ............ 250/208.1; 327/91; 348/311
See application file for complete search history.

(56) References Cited

U.S. PATENT DOCUMENTS

2002/0017646 A1 * 2/2002 Hynecek .................... 257/72

OTHER PUBLICATIONS

J.P. Theuwissen, "Solid-State Imaging with Charge-Couple Devices" Kluwer Academic Publishers, pp.1 76-79, 1995.

* cited by examiner

*Primary Examiner*—Seung C. Sohn
(74) *Attorney, Agent, or Firm*—Alan K. Stewart; W. James Brady, III; Frederick J. Telecky, Jr.

(57) ABSTRACT

The charge detection device includes a floating diffusion, a reset transistor, a feed through shielding transistor, and a bias tracking voltage reference generator for biasing an output diode. The reset feed through shielding transistor gate overlaps the reset transistor gate to minimize the reset feed through. The bias tracking voltage reference generator output is adjusted such as to set a predetermined reset time constant for the device and to optimize the detection node performance by minimizing the charge spill back during the reset transistor turning off interval.

8 Claims, 2 Drawing Sheets

CHARGE DETECTION NODE WITH RESET FEED-THROUGH SHIELDING GATE

FIELD OF THE INVENTION

The present invention relates to solid-state image sensors, specifically to charge detection nodes of image sensors that employ bias tracking voltage reference generators and have high dynamic range, low noise, good linearity, and a small reset feed through.

BACKGROUND OF THE INVENTION

A typical image sensor senses light by converting impinging photons into electrons that are integrated (collected) in the sensor pixels. After completion of integration cycle charge is converted into a voltage that is supplied to the output terminals of the sensor. The charge to voltage conversion is accomplished either directly in the sensor pixels, such as in the Active Pixel CMOS image sensors, or remotely, off the sensing area, in charge conversion amplifiers. The key element of every charge conversion amplifier is the charge detection node. As charge is transferred onto the node its potential changes in proportion to the amount of transferred charge and this represents signal. The charge detection node is typically connected to a gate of a suitable MOS transistor that serves as a first stage of the amplifier. The charge detection node is also provided with a reset transistor that removes charge from the node after sensing.

There are many charge detection node and amplifier designs known in the literature. The most popular structure is the Floating Diffusion (FD) architecture. The detail description of such systems can be found, for example, in the book: "Solid-State Imaging with Charge-Coupled Devices" by Albert J. P. Theuwissen pp. 76–79 that was published in 1995 by Kluwer Academic Publishers.

The performance of any charge detection system can be evaluated according to the following main criteria: the charge conversion factor, dynamic range, noise floor, reset feed-through, and linearity. The charge conversion factor is determined by the overall detection node capacitance that also includes the node parasitic capacitances. It is thus desirable to minimize the parasitic capacitances and maximize the charge conversion factor. The Dynamic Range (DR) of the node is determined by the ratio of maximum charge handling capacity to the noise floor. It is desirable to minimize the noise floor in order to maximize the DR. The FD charge detection node has to be reset after sensing of charge. The reset is typically accomplished by turning on a reset transistor that is connected to the node. The reset transistor, however, causes a reset feed through that is introduced to the node through a capacitive coupling from the gate of the reset transistor. The reset feed through consumes a portion of the DR, so it is advantageous to minimize the reset feed through. A significant portion of the reset feed through is also caused by charge spilling back from the reset transistor channel onto the node when the transistor is turned off. This charge spill back contributes noise, so it is advantageous to minimize it.

SUMMARY OF THE INVENTION

It is an object of the present invention to overcome limitations in the prior art. It is a further object of the present invention to provide a practical floating diffusion (FD) charge detection node design with low noise floor, low reset feed through and a predetermined reset time constant. It is yet another object of the present invention to provide a practical high performance charge detection node design whose charge handling capacity is high resulting in high dynamic range (DR) and large output voltage swing. Finally, it is the object of the present invention to provide a FD charge detection node design that has a stable performance, which does not significantly change with process parameter variations or external bias variations.

Incorporating a bias tracking voltage reference generator connected to an output diode and including a reset feed through shielding gate into the detection node achieves these and other objects of the invention.

BRIEF DESCRIPTION OF DRAWINGS

The invention will be described in detail in the following description of preferred embodiments with reference to the following figures wherein.

DETAIL DESCRIPTION OF PREFERRED EMBODIMENTS

Figure 1:
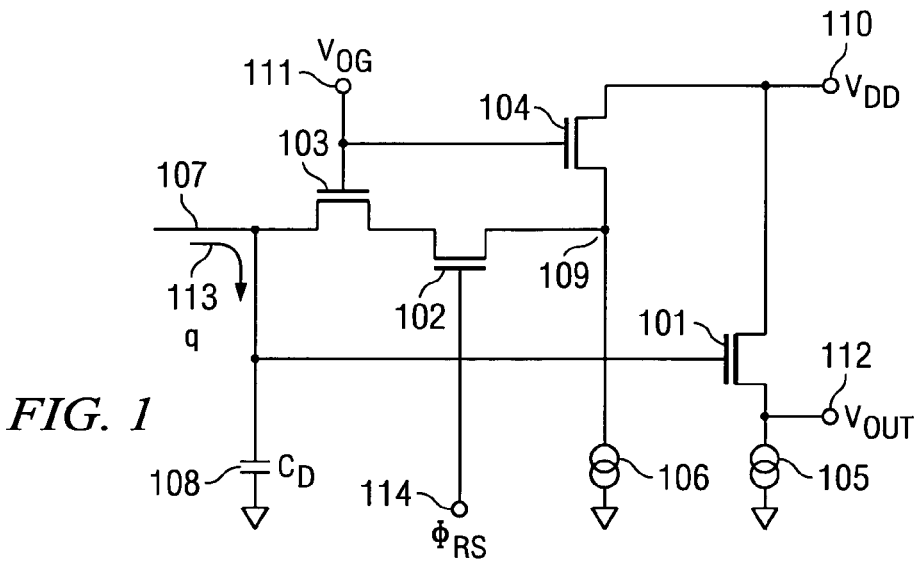
FIG. 1 is a simplified circuit diagram of the present invention that includes an equivalent charge detection node capacitor, the reset transistor, the reset feed through shielding transistor, the reference voltage generator for the output diode, and the first stage of the amplifier.

FIG. 1 is a circuit diagram that describes the functionality of the charge detection system according to the present invention. The capacitor 108 (Cd) represents the overall capacitance of the charge detection node 107. This capacitance includes the floating diffusion (FD) capacitance, the input capacitance of transistor 101, and all the parasitic capacitances that are connected to this node. As charge 113 (q) is transferred onto the node 107, the node voltage changes and the transistor 101, which is the part of the first stage of the amplifier, senses this change. The source of transistor 101 is biased by a suitable current source 105 or it may be biased by some other suitable loading element such as a resistor. The output appears on terminal 112 (Vout) and may be supplied to other stages of the amplifier or directly to the chip output bonding pads. The drain of the transistor 101 is connected to a power supply terminal 110 (Vdd). Other types of the transistors, such as Junction FET transistors, can be used in this stage as is well known in the art.

The reset transistor 102 that is connected between the output 109 of the reference voltage generator and the feed through shielding transistor 103 accomplishes the detection node reset. Applying a suitable pulse $\phi_{rs}$ to the reset terminal 114 activates this reset.

An important component of the charge detection system 100 is the bias tracking reference voltage generator that consists of the transistor 104 and its bias current source 106. The reference voltage generator provides a bias for the output diode of the charge detection node that is derived from the bias of the reset feed through shielding gate. The bias tracking minimizes the detection node performance variations cussed by variations in processing parameters as well as variations in external biasing.

The gate of the transistor 104 is connected to the gate of the feed through shielding transistor 103 and both gates together are connected to the output gate biasing terminal 111 (Vog). The drain of the transistor 104 is connected to the terminal 110 (Vdd), however this is not mandatory. The transistor 104 can have its own and completely separate biasing terminal as is well know to those skilled in the art. The transistors 103 and 104 have exactly the same gate structure and have exactly the same gate width. The transistor 104, however, may consist of many identical units connected in parallel to increase its driving power. This feature provides parameter tracking between these two transistors. Choosing a suitable current for the current source 106 determines the amount of charge that is stored under the gate of the transistor 103 and will determine the transistor channel resistance. For higher currents, more charge will be stored in the channel and the channel will have less resistance. The parameter tracking between the transistor 103 and 104 is, therefore, important for keeping the amount of charge in the channel of transistor 103 constant and independent of processing variations. It is also advantageous to keep the amount of charge constant when the external bias to the output gate terminal 111 changes. The above-described arrangement provides this capability.

Figure 2:
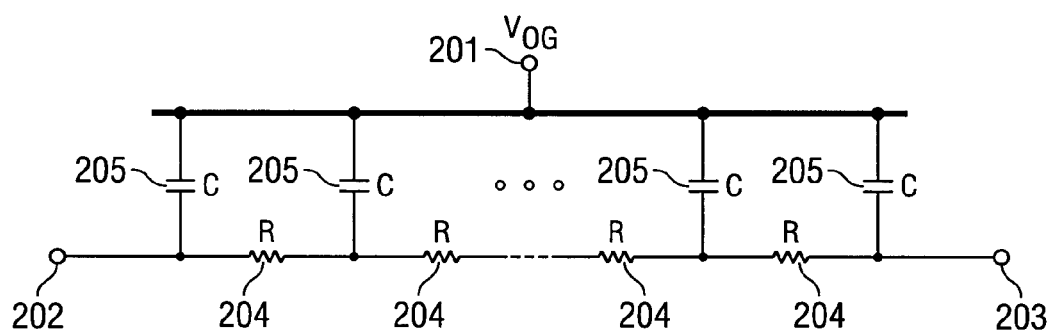
FIG. 2 is an equivalent circuit diagram of the reset feed through shielding transistor, the transistor channel represents essentially a distributed RC line.

FIG. 2 shows a detail schematic diagram of the reset feed through shielding transistor 103. The gate 201 of this transistor is connected to the terminal 111 (Vog). The transistor channel forms essentially a distributed RC network where the values of the resistors 204 (R) are determined by the amount of charge stored in the channel as already explained. The capacitors 205 all summed together represent the total gate-to-channel capacitance. The source 202 is connected to the detection node 107 (floating diffusion) and the drain 203 to the reset transistor 102. There is no physical drain diffusion common to transistors 102 and 103. These transistors can be considered as a single dual gate transistor. This is shown in more detail in the device cross section drawing in FIG. 4.

Figure 3:
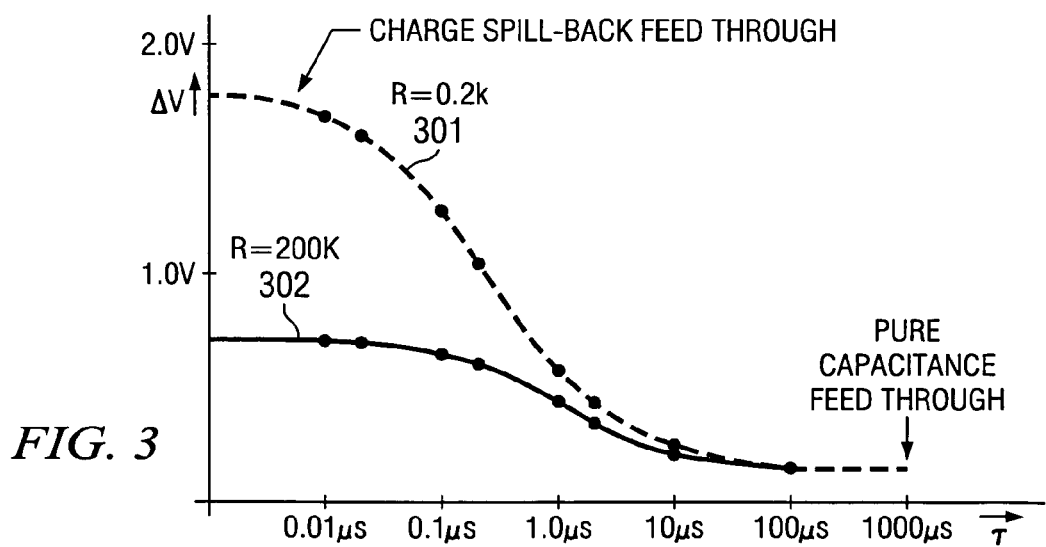
FIG. 3 is a graph of the voltage that results from charge spilling back from the channel of the reset transistor onto the node versus the reset pulse turn off time for two different biasing levels of the reference voltage generator, the two different bias levels correspond to two different channel resistances.

The value of the resistors 204 determines the reset time constant of the node 107, but it is also important for determining the amount of charge that will be spilled back onto the detection node, when the reset transistor 102 is turned off. This is plotted on the graphs in FIG. 3. The curves represent a change in the voltage of the node caused by charge spilled back onto the node for the resistor values of 0.2 kOhm, the curve 301, and 200 kOhm, the curve 302. The horizontal axis of the graph represents the turn off time of the reset pulse. In order to minimize the detection node noise floor and maximize the DR it is important to keep the amount of spill back charge at minimum. The amount of charge that is kept in the channel of the transistor 103 is thus very critical for the optimum node performance and its level is best maintained by the parameter tracking arrangement as described above.

Figure 4:
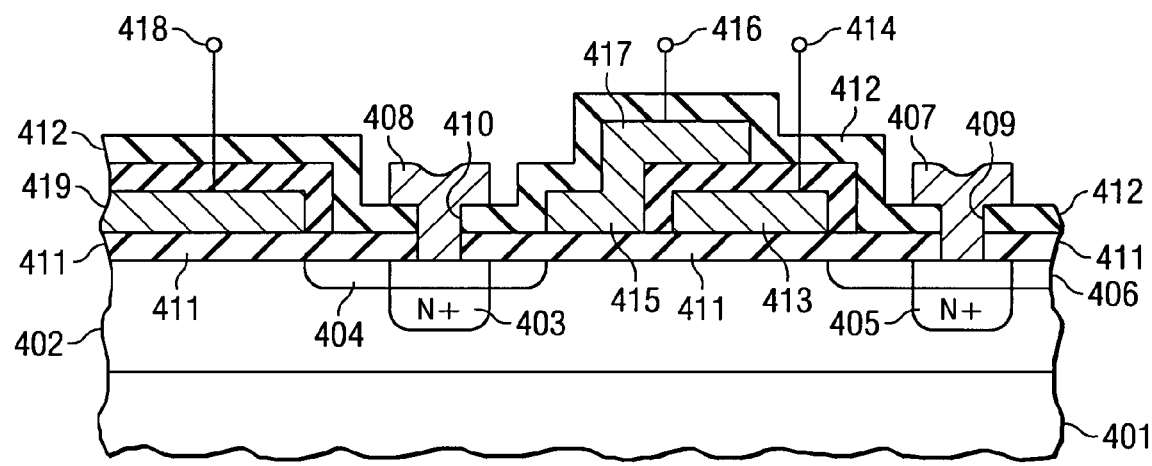
FIG. 4 is a cross section of the charge detection node showing details of the FD design, the output diode design, the reset transistor design, and the reset feed through shielding gate design.

FIG. 4 shows the cross section 400 of the charge detection node that includes the FD n+ diffusion 403, the output diode n+ diffusion 405, the output gate 419, the reset transistor gate 413, and the reset feed through shielding gate 415 and 417. The reset feed through shielding gate 415 and 417 consists of two portions, the portion 415 that forms the gate of the feed through shielding transistor 103, and the gate overlap portion 417. The gate overlap 417 is important for shielding the capacitive coupling from the reset gate 413 to the detection node contact metal 408 over the top of the structure. The device is built on a p-type silicon substrate 401 to which a buried channel 402 has been either diffused or implanted from the top. The gates are isolated from the substrate and from each other by suitable dielectric layers 411 and 412 that are either single layers of silicon dioxide or a suitable stack of various gate dielectrics such as oxide-nitride-oxide (ONO) or other. The gates themselves are typically formed form polycrystalline silicon. The first deposited poly-silicon layer forms the gates 413 and 419, while the second deposited poly-silicon layer forms the gate 415/417. Other suitable materials can be used for the gates, for the dielectric layers, and for the substrate as is well known to those skilled in the art. The contact holes 409 and 410 provide openings for metal 407 and 408 to connect the n+ diffusions to the various other components of the circuit of the silicon chip. The gates are biased via the leads 414, 416 and 418, which is shown on the drawing only schematically. An important feature of the device is the diffusions 404 and 406, which are formed by a lighter n-type doping than the doping of the n+ diode regions 403 and 405. The lighter doping reduces the overlap of gates 419 and 415 over these regions, which reduces the parasitic capacitance and in turn increases the node conversion gain. The doping layers 404 and 406 are formed in a self-aligned manner after the poly-silicon gates are already deposited and defined. It is also important to mention that the size of the gate 415 plays an important role in the linearity of the node charge-to-voltage conversion. A larger gate size represents more capacitance that is connected to the node; however, it improves linearity and feed through shielding. The larger gate also increases the reset node time constant. The capacitance of the FD n+ region 403 is voltage dependent and, therefore, causes non-linearity, while the capacitance of the gate 415 is constant. A suitable combination of the FD capacitance with the feed through gate 415 capacitance improves the node linearity.

The device cross section shown in FIG. 4 includes transistors 102 and 103 from FIG. 1. The gate of transistor 102 is gate 413 in FIG. 4. The gate of transistor 103 is gate 415/417 in FIG. 4. Node 107 in FIG. 1 is contact 408 in FIG. 4, and node 109 is contact 407 in FIG. 4.

Figure 5:
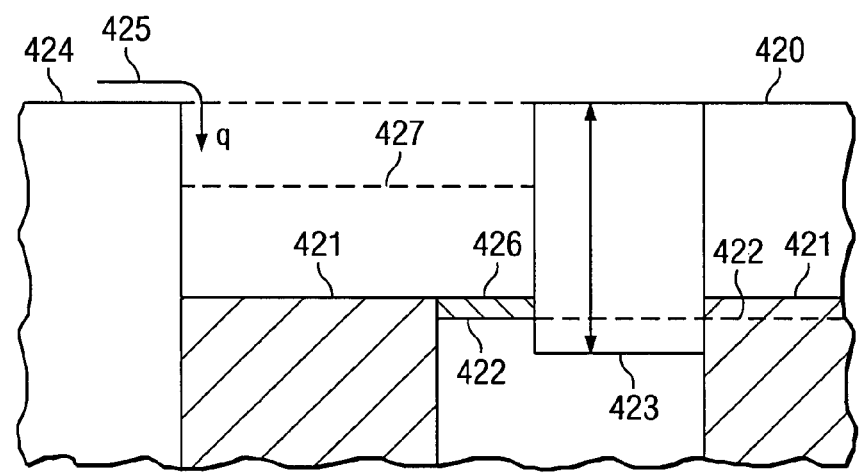
FIG. 5 is a potential profile for the entire structure shown in FIG. 4.

Finally, for more clarity, the potential profile of the device of FIG. 4 is shown in FIG. 5. A suitable bias that is applied to the gate 415/417 via the lead 416 determines the potential level 422. The current selected for loading of the transistor 104, (current source 106), determines the level 421, which is the bias level for the output diode 405. These two potential levels, 422 and 421 track each other and determine the amount of charge 426 under the gate 415 and thus the reset node time constant. When the process parameters change, or the bias of the gate changes, the amount of charge 426 always remains approximately the same. When the reset gate 413 is at its off state, the potential under gate 413 is at the level 420. During this time, charge 425 is transferred across the potential level 424 to the detection node 403, and changes the detection node potential to level 427. This is the desired signal sensed by the amplifier first transistor stage 101. To accomplish reset, the reset transistor is turned on and the potential under the gate 413 changes to level 423. This removes charge 427 from the detection node 403, and returns the detection node to the original potential 421. After this cycle is completed the detection node 403 is ready to receive the next charge pocket for conversion into a voltage.

The present invention can be used in all known CCD image sensor architectures as well as in most CMOS image sensor architectures.

Having described preferred embodiments of the novel charge detection node with high conversion gain, good linearity, high DR, low feed through, and low noise, that includes a bias tracking voltage reference generator, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as defined by the appended claims.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A charge detection device comprising:
   a floating diffusion;
   a feed through shielding transistor coupled to the floating diffusion;
   a reset transistor coupled to the shielding transistor;
   an output diode diffusion coupled to the reset transistor;
   a bias tracking voltage reference generator coupled to the output diode diffusion for providing bias to the output diode diffusion; and
   wherein an input of the reference generator is coupled to a gate of the feed through shielding transistor.

2. The device of claim 1 wherein the gate of the feed through shielding transistor overlaps a gate of the reset transistor.

3. The device of claim 1 wherein a fixed amount of charge is kept under the gate of the feed through shielding transistor to provide a reset time constant.

4. The device of claim 1 wherein a low-doped region surrounds the floating diffusion and is adjacent to the gate of the feed through shielding transistor for the purpose of minimizing the gate to n+ overlap capacitance.

5. The device of claim 1 wherein the floating diffusion is an n+ diffusion region.

6. The device of claim 5 wherein a low-doped n type region surrounds the n+ floating diffusion region and is adjacent to the gate of the feed through shielding transistor for the purpose of minimizing the gate to n+ overlap capacitance.

7. The device of claim 1 wherein the voltage reference generator comprises a transistor that is equivalent to the feed through shielding transistor.

8. The device of claim 7 wherein a predetermined amount of charge is maintained in a channel of the feed through shielding transistor after a reset has been made, independent of process parameter variations and gate bias variations.

* * * * *